(12) United States Patent
Alpay et al.

(10) Patent No.: US 6,841,309 B1
(45) Date of Patent: Jan. 11, 2005

(54) DAMAGE RESISTANT PHOTOMASK CONSTRUCTION

(75) Inventors: H. Ufuk Alpay, Poughquag, NY (US); Joseph S. Gordon, Gardiner, NY (US); Gregory P. Hughes, Austin, TX (US); Franklin D. Kalk, Austin, TX (US)

(73) Assignee: DuPont Photomasks, Inc., Round Rock, TX (US)

( * ) Notice: Subject to any disclaimer, the term of this patent is extended or adjusted under 35 U.S.C. 154(b) by 211 days.

(21) Appl. No.: 10/044,076

(22) Filed: Jan. 11, 2002

Related U.S. Application Data

(60) Provisional application No. 60/261,040, filed on Jan. 11, 2001.

(51) Int. Cl.[7] .................................................. G03F 9/00
(52) U.S. Cl. ........................................................ 430/5
(58) Field of Search ............................... 430/5; 378/34, 378/35

(56) References Cited

U.S. PATENT DOCUMENTS

| | | | |
|---|---|---|---|
| 5,989,754 A | 11/1999 | Chen et al. ..................... 430/5 |
| 5,999,397 A | 12/1999 | Chen et al. ................... 361/212 |
| 6,162,302 A | 12/2000 | Raghavan et al. .............. 134/3 |
| 6,178,221 B1 | 1/2001 | Levinson et al. ............. 378/35 |
| 6,248,950 B1 | 6/2001 | Hoeber et al. ............... 136/251 |
| 6,261,725 B1 * | 7/2001 | Tzu et al. ....................... 430/5 |
| 6,291,114 B1 | 9/2001 | Reijers ........................... 430/5 |
| 6,309,781 B1 | 10/2001 | Gemmink et al. ............. 430/5 |
| 6,544,693 B2 * | 4/2003 | Levinson et al. .............. 430/5 |
| 2001/0041378 A1 | 11/2001 | Englisch ....................... 438/16 |

* cited by examiner

*Primary Examiner*—Saleha R. Mohamedulla
(74) *Attorney, Agent, or Firm*—Baker Botts L.L.P.

(57) ABSTRACT

A method for fabricating a damage resistant photomask includes forming a photomask pattern on a substrate and forming a transparent, protective coating on the photomask pattern. The protective coating may be an electrical insulator (e.g., spin-on glass). In addition, an antireflective layer may be applied to the protective coating. A pellicle may also be attached over the protective coating. The protective coating may prevent electrostatic energy from forming on or arcing between features on the photomask pattern and damaging the features. The protective layer may also prevent the photomask pattern from being damaged by or reacting with other substances, such as cleaning solutions.

22 Claims, 5 Drawing Sheets

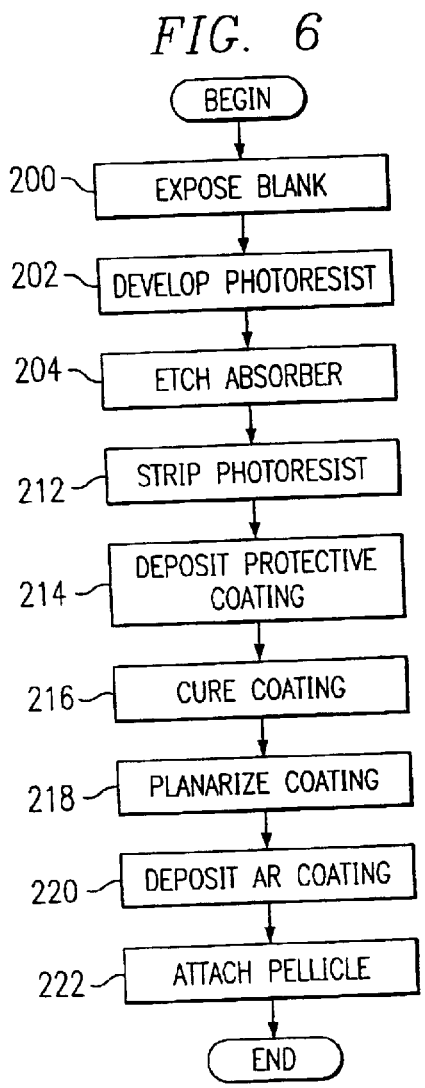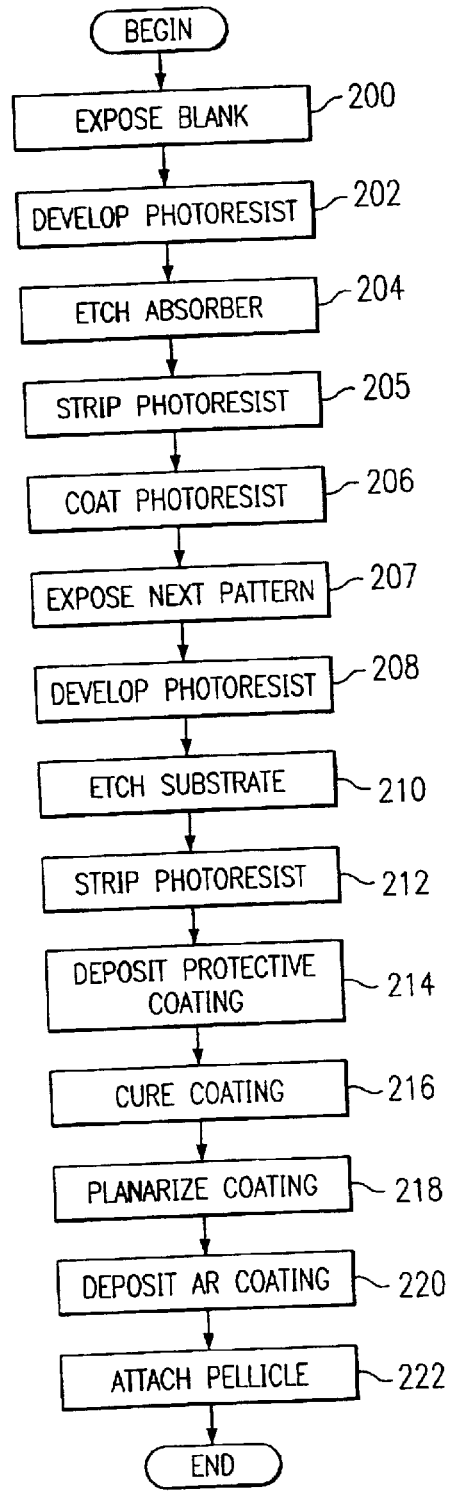

DAMAGE RESISTANT PHOTOMASK CONSTRUCTION

CROSS REFERENCE TO RELATED APPLICATION

This application claims priority from U.S. Provisional Patent Application Ser. No. 60/261,040, filed Jan. 11, 2001, and entitled "ESD-Resistant Photomask Construction."

TECHNICAL FIELD OF THE INVENTION

This invention relates in general to the field of photolithography. In particular, the invention relates to photomasks used in photolithography and to methods for manufacturing and using such photomasks.

BACKGROUND OF THE INVENTION

A photolithography system typically uses a photomask, also known as a "mask" or "reticle," to transfer a pattern into a substrate. For example, manufacturers of integrated circuits (ICs) use photomasks as masters to optically transfer precision images from the photomasks onto semiconductor wafers. A photomask is a crucial component of a photolithography system because the photomask serves as the template that creates the image of a complex pattern, such as an integrated circuit layer, on a wafer.

To create a photomask, a photomask manufacturer may use a standard photolithography process, such as laser or electron beam lithography, to form the desired pattern on one surface of a high-purity quartz or glass plate, sometimes referred to as a "photomask blank" or "substrate." The photomask pattern is defined by areas that are covered by a chrome-based or other optical absorber and areas that are free of optical absorber. The former areas are referred to as chrome, dark, or opaque, while the latter are referred to as clear or glass. The pattern, sometimes referred to as the "geometry" or "image," may include millions of individual, microscopic features.

Imperfections in the pattern may render the photomask worthless. Imperfections may arise during the process of forming the pattern. Imperfections may also be caused by damage after the forming process is complete. A single printable imperfection on a photomask can bring the yield for a semiconductor device to zero. Consequently, before being shipped to the customer, the photomask must be carefully cleaned and then inspected for imperfections such as production defects and dust contamination. Cleaning is very important, because a tiny amount of dust on a photomask pattern can render the photomask inoperable. That is why photomasks are made and used in cleanroom environments.

However, as recognized by the present invention, one disadvantage associated with a typical conventional photomask is that the pattern is quite susceptible to damage, particularly in the cleaning process and in the wafer printing process. For example, optical absorber is typically very reactive, and it may be damaged by substances such as sulfur in the atmosphere or in cleaning solutions. In addition, brushes may be used to clean the pattern, and those brushes may damage the pattern either directly or by causing electrostatic discharges (ESDs) to occur. An ESD occurs when an electrical charge builds up on one feature of the pattern and then arcs over to another feature. This phenomenon is similar to what happens when a person gets a static shock from touching a door handle after rubbing one's feet on carpet. With the microscopic features found in current generation photomasks, ESDs may generate enough current and heat to actually melt the features involved.

To protect the pattern from dirt, a manufacturer may attach a pellicle to a mask before the mask is shipped to the customer. A pellicle is a thin membrane or plate that is suspended above the pattern by a metal frame. Since the membrane is suspended above the pattern, any dust that lands on the membrane will be out of focus in the projected pattern image. The pellicle thus helps to ensure the image quality of the pattern projected on the wafer. Because of their uniformity and extreme thinness, pellicles provide necessary protection but do not introduce image degradation when inserted into the optical path. Pellicles are nevertheless susceptible to damage and contamination, and pellicles therefore sometimes require replacement. Before a new pellicle is attached, the photomask pattern must again be cleaned, and, as explained above, photomask patterns are particularly susceptible to damage during cleaning operations.

SUMMARY OF THE INVENTION

Therefore, as recognized by the present invention, a need therefore exists for a way to protect photomasks from ESDs and other causes of damage during cleaning operations and other types of operations that can result in damage to photomask patterns. In accordance with the teachings of the present invention, disadvantages and problems associated with protecting photomask patterns from damage have been substantially reduced or eliminated.

In a particular embodiment, a method for fabricating a damage resistant photomask is disclosed that includes the operations of forming a photomask pattern on a substrate and forming a transparent, protective coating on the photomask pattern. The protective coating may be an electrical insulator with a higher dielectric strength than air (e.g., spin-on glass). In addition, an antireflective layer may be applied to the protective coating. A pellicle may also be attached over the protective coating. The protective coating may prevent electrostatic energy from forming on or arcing between features on the photomask pattern and damaging the features. The protective layer may also prevent the photomask pattern from being damaged by or reacting with other substances, such as cleaning solutions. Another embodiment of the invention may include a damage resistant photomask fabricated according to the above method.

A method for using a damage resistant photomask according to the present invention may be employed by a manufacturer of products such as integrated circuits. Such a method uses a damage resistant photomask that features a pattern of opaque and clear areas and a protective layer formed on the pattern of opaque and clear areas. For instance, the manufacturer may project electromagnetic radiation through the clear areas and the protective layer of the photomask onto a wafer that has been coated with photoresist. The manufacturer may then develop the photoresist to leave a pattern of photoresist on the wafer that corresponds to the pattern of opaque and clear areas on the photomask.

Technical advantages of certain embodiments of the present invention include greater resistance to photomask pattern damage. For instance, more aggressive cleaning techniques may be used to clean a photomask according to the present invention. In addition, risks of damage from ESDs are reduced. Also, damage resistant photomasks may be used by chip manufacturers in photolithography processes designed for conventional photomasks.

BRIEF DESCRIPTION OF THE DRAWINGS

A more complete understanding of the present invention and advantages thereof may be acquired by referring to the following description of various example embodiments, together with the accompanying drawings, in which:

FIGS. 6 and 7 present example methods for fabricating photomasks according to the invention.

DETAILED DESCRIPTION

Preferred embodiments of the present invention and their advantages may be better understood by reference to the example process and structures illustrated in FIGS. 1 through 7.

Figure 1:
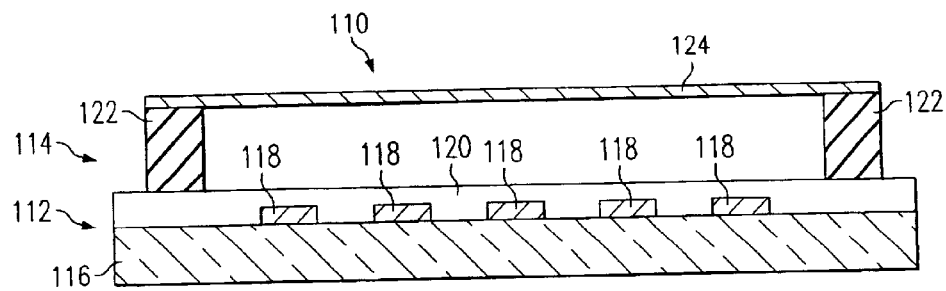
FIG. 1 illustrates a cross-sectional view of a photomask with a protective coating on the photomask pattern according to an example embodiment of the present invention.

FIG. 1 illustrates a cross-sectional side view of a photomask assembly 110 according to a first example embodiment of the invention. In that embodiment, photomask assembly 110 includes a photomask 112 (otherwise known as a "mask" or "reticle") coupled to a pellicle 114. Photomask 112 includes a substrate 116, a pattern of optical absorbers 118, and, as described below, a protective layer 120. As explained in greater detail below with reference to FIG. 3, optical absorbers 118 form a pattern on a surface of photomask 112. For example, the image may correspond to a layer of an integrated circuit, for use in manufacturing integrated circuits.

Figure 2:
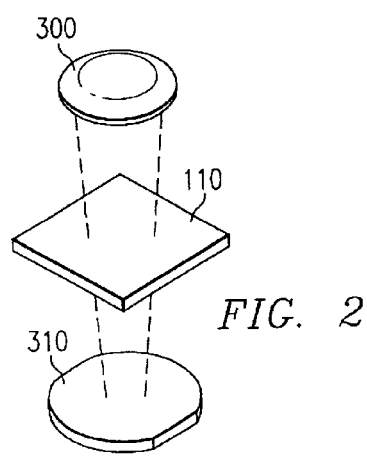
FIG. 2 presents an isometric view of an example lithography system using a photomask with a protective coating to produce an image on a wafer.

For instance, FIG. 2 depicts a lithography system in which a lamp 300 projects electromagnetic radiation (EMR) through photomask assembly 110 to reproduce the photomask pattern on a surface of a silicon wafer 310. In a preferred embodiment, photomask assembly 110 may be used in place of a conventional photomask in an otherwise conventional lithography system.

As shown, photomask assembly 110 is substantially rectangular in one example embodiment. However, alternative photomask embodiments according to the invention may have a variety of sizes and shapes, including but not limited to round or square. Photomasks according to the invention may also be any variety of photomask types, including, but not limited to, a onetime master, a five-inch reticle, a six-inch reticle or any other size reticle suitable to project an image of a pattern (e.g., a circuit layer) onto an object substrate (e.g., a silicon wafer). Furthermore, such a photomask may be a binary mask, a phase shift mask, or any other type of mask suitable for use in a lithography system.

For some applications, the substrate may be a transparent material such as quartz, synthetic quartz, fused silica, magnesium fluoride (MgF$_2$), calcium fluoride (CaF$_2$), or any other suitable material. For instance, the substrates for some applications may transmit approximately ninety-nine percent of incident light having a wavelength between approximately 120 nanometers (nm) and approximately 450 nm.

In the example embodiment, optical absorber 118 may be chrome and may be referred to generally as "absorber." For some applications, the optical absorbers may be chrome, chromium nitride, a metallic oxy-carbo-nitride (e.g., MOCN, where M is selected from the group consisting of chromium, cobalt, iron, zinc, molybdenum, niobium, tantalum, titanium, tungsten, aluminum, magnesium, and silicon), or any other suitable material. For some applications, the optical absorbers may be a material that absorbs light with wavelengths between approximately 120 nm and approximately 450 nm. In some embodiments, the optical absorbers may be a partially transmissive material, such as molybdenum silicide (MoSi), which has a transmissivity of approximately one percent to approximately thirty percent.

Frame 122 and pellicle film 124 form pellicle 114. Pellicle film 124 may be a thin film membrane formed of a material such as nitrocellulose, cellulose acetate, an amorphous fluoropolymer, such as Teflon® AF manufactured by E. I. du Pont de Nemours and Company, or another suitable film, including deep ultraviolet films. Pellicle film 124 may be prepared by a conventional technique such as spin casting. Frame 122 is typically formed of anodized aluminum, although it could alternatively be formed of stainless steel, plastic, or other suitable materials.

Figure 3:
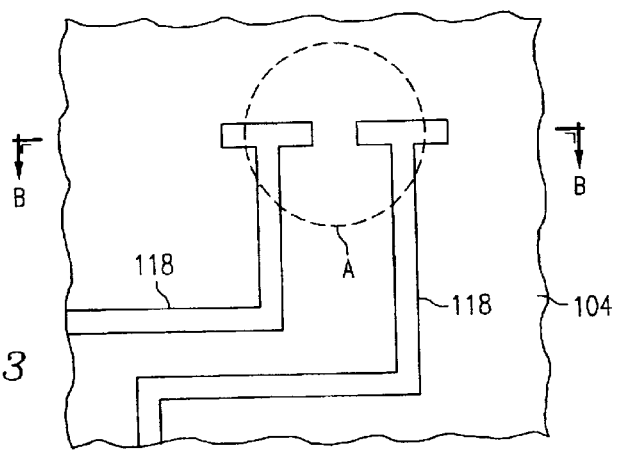
FIG. 3 is a schematic drawing with portions broken away showing a top view of a portion of a photomask according to an example embodiment of the invention.

FIG. 3 illustrates a top view of part of photomask assembly 110. The illustrated part of photomask assembly 110 includes a part of the photomask pattern, defined by a relatively large clear area 104 and two opaque or dark areas of optical absorber 118. As described in greater detail below with reference to FIGS. 4A–4H, a photolithography process may be used to fabricate photomask assembly 110. Such a process typically includes the operations of exposing particular areas of a photoresist layer on a photomask blank, developing the photoresist to create a pattern, etching the regions of an opaque layer not covered by photoresist, and then removing the remaining photoresist to leave a patterned opaque layer over a transparent substrate. The pattern may be based on an original photomask pattern data file that has been derived from a circuit design pattern. The desired pattern may be imaged on the photomask blank using a laser, electron beam, or X-ray lithography tool. For instance, the lithography tool may use an argon-ion laser that emits light having a wavelength of approximately 364 nanometers (nm), for example. Alternative lithography tools may use lasers emitting light at wavelengths from approximately 150 nm to approximately 300 nm, for example.

FIGS. 4A–4H depict a cross section of the part of photomask assembly 110 surrounded by dashed circle A, taken along line B. Specifically, FIGS. 4A–4H illustrate various stages in the fabrication process that culminates when photomask assembly 110 is completed.

FIGS. 5A–5F illustrate various stages in a similar process. However, FIGS. 4A–4H involve an example binary mask, while FIGS. 5A–5F involve an example alternating aperture phase shift (AAPS) mask. The top view of photomask assembly 110 in FIG. 3 may apply to both binary masks and AAPS masks. However, the fabrication process for AAPS masks is slightly more complicated than the process for binary masks. The flowcharts of FIGS. 6 and 7 describe steps in example processes for fabricating binary and AAPS masks, respectively.

Figure 4A:
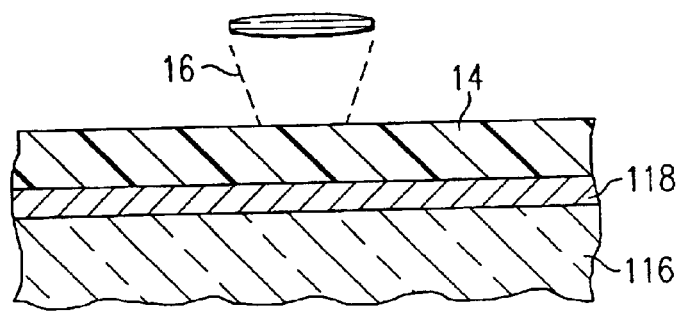
FIGS. 4A–4H are schematic drawings with portions broken away showing cross-sectional side views at various stages of manufacturing a photomask as shown in FIG. 2.

Referring now to block 200 of FIG. 6, the example process begins with the photomask manufacturer exposing a pattern onto a photomask blank. As illustrated in FIG. 4A, the photomask blank includes a transparent substrate 116, a layer of optical absorber 118 that coats a surface of transparent substrate 116, and a layer of photoresist 14 that coats optical absorber 118. The photomask manufacturer may expose the pattern in photoresist 14 using an electron beam or laser beam 16, for instance.

Figure 4B:
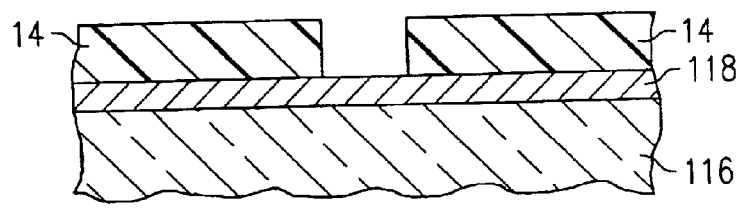
Figure 4C:
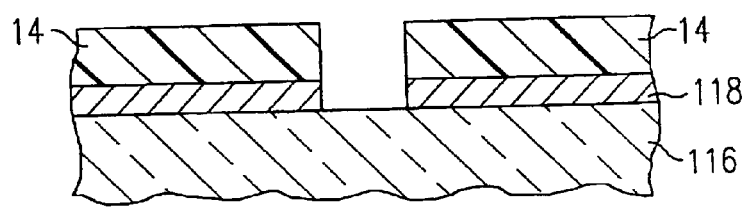

As depicted in block 202 and FIG. 4B, photoresist 14 is then developed, which causes portions of photoresist 14 to be removed according to the pattern exposed in the previous step. In the example embodiment of FIGS. 4A–4H, a positive resist process is used, in which a developer dissolves the areas of photoresist 14 that have been exposed, to uncover regions of optical absorber 118 formed on transparent substrate 116. However, negative photoresist may be used in alternative embodiments. As shown in block 204 and FIG. 4C, the manufacturer then etches away optical absorber 118 in the areas that have been cleared of photoresist 14 to expose areas of transparent substrate 116.

The above steps of exposing the blank, developing the photoresist, and etching the absorber typically also apply to AAPS masks, as indicated in FIG. 7 at blocks 200–204. Generally, however, when fabricating an AAPS mask, alternating clear areas of substrate are then etched to form depressions known as "trenches." A mask with such trenches preferably causes alternating phase shifts when used to image a pattern in the process of fabricating an integrated circuit. As indicated at blocks 205–208 of FIG. 7, additional operations for creating trenches in the mask may include stripping and re-coating the mask with photoresist, writing or imaging the new photoresist, and developing the photoresist to expose the areas of transparent substrate 116 to be trenched.

Figure 5A:
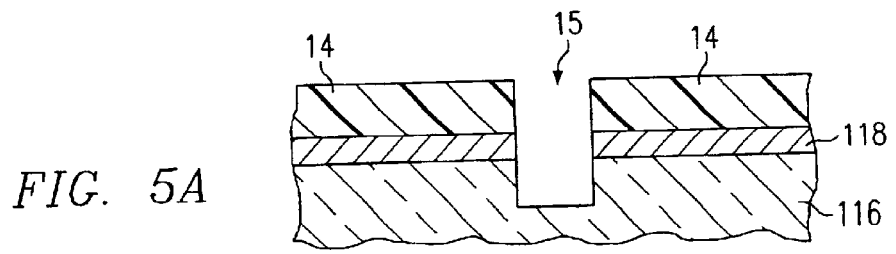
FIGS. 5A–5F are schematic drawings with portions broken away showing cross-sectional side views at various stages of manufacturing an alternative type of photomask in accordance with teachings of the present invention.

For instance, as shown in block 210 and FIG. 5A, the manufacturer may etch exposed areas of a transparent substrate 116 to form trenches, such as trench 15. The depth of trench 15 is preferably designed to cause a phase shift in the EMR that passes through trench 15 and transparent substrate 116, relative to the EMR that passes through other clear areas (e.g., clear areas without trenches). A plasma etcher (not expressly shown) may be used to form the trenches. For binary masks such as photomask 112, however, substrate 116 preferably is not etched.

Figure 4D:
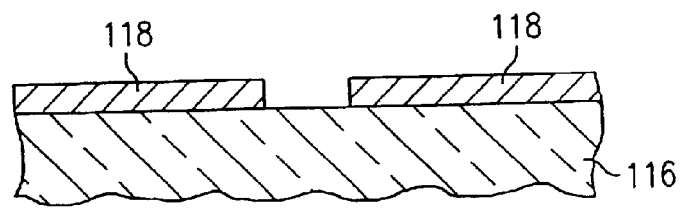
Figure 5B:
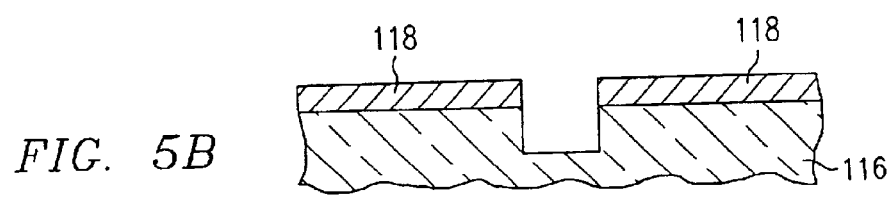

After optical absorber 118 and, in the case of AAPS masks, substrate 116 have been etched, photoresist 14 is stripped from the patterned blank, as shown in FIGS. 4D and 5B and in block 212 of FIGS. 6 and 7. At this point, the photomask may be referred to as a "patterned substrate." Also, the process of etching absorber 118 to create the pattern and, in AAPS masks, etching substrate 116, may be referred to as "patterning" the mask.

Figure 4E:
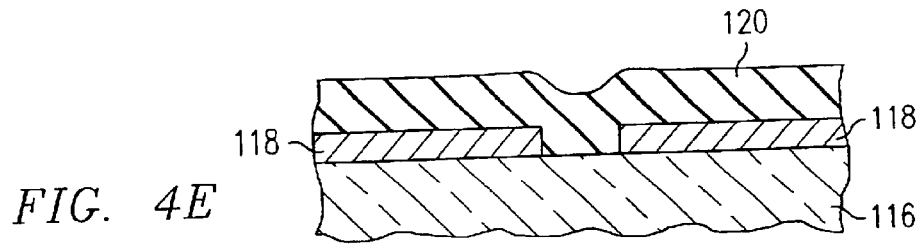
Figure 5C:
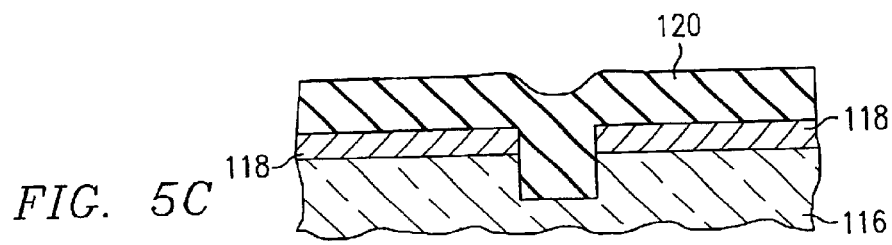

As depicted in FIGS. 4E and 5C, for both binary masks and AAPS masks, after the pattern has been formed, the photomask manufacturer then forms one or more layers of protective coating 120 on the patterned substrate. In the example process, protective coating 120 is a transparent, dielectric material, (e.g., spin-on glass). For binary masks, the protective coating may be composed largely of silicon dioxide ($SiO_2$). For AAPS masks, it may be preferable to use a coating with a higher refractive index. For instance, in AAPS masks, a protective coating composed of sputter-deposited hafnium oxide ($HfO_2$) may be used. Hafnium oxide has a refractive index of approximately 2.25 at 248 nm, a wavelength typically used in semiconductor lithography. In alternative embodiments, however, other types of coatings may be used, including, but not limited to, aluminum oxide ($Al_2O_3$), aluminum nitride (AlN), silicon nitride ($Si_3N_4$), tantalum oxide ($Ta_2O_5$), yttrium oxide ($Y_2O_3$), magnesium fluoride ($MgF_2$), magnesium oxide (MgO), zirconium oxide ($ZrO_2$), lithium fluoride (LiF), aluminum fluoride ($AlF_3$), calcium fluoride ($CaF_2$), and indium-tin oxide (i.e., indium oxide doped with tin oxide; also known as "ITO").

In the example embodiments, protective coating 120 is formed by using a standard spin coater to deposit a spin-on glass solution onto the patterned substrate and then curing the solution on the photomask, for example by baking, firing, or electron beam curing, as depicted in blocks 214 and 216 of FIGS. 6 and 7. Protective coating 120 may also be referred to as "protective material" or a "protective layer" 120, and protective layer 120 protects optical absorber 118 from damage during processes such as photomask cleaning, for example. As noted above, the protective layer may be deposited by a method other than spin-on glass, such as magnetron sputtering, thermal or electron beam evaporation, chemical vapor deposition, or ion beam sputtering.

As recognized by the present invention, a typical conventional photomask is particularly susceptible to ESD damage because the substrate is a dielectric, the optical absorber is an electrical conductor, and the most significant thing separating many or all of the features from each other may be air. In the example embodiments of the present invention, since protective layer 120 is dielectric, protective layer 120 prevents electrostatic charges from accumulating on features in the photomask pattern during operations such as cleaning. For instance, in the example embodiment, protective layer 120 may have an electrical resistivity greater than $10^6$ ohm meters. In some alternative embodiments, the protective coating may be made from a material that has an electrical resistivity of at least ten ohm meters. Protective layer 120 may further prevent the features from being damaged by electrostatic discharges by preventing electrostatic discharges between features.

Furthermore, in the example embodiments, protective layer 120 preferably hermetically seals one entire surface of the photomask, and protective layer 120 is preferably chemically inactive, relative to optical absorber 118. Consequently, once the photomask pattern has been coated with protective layer 120, the pattern may safely be exposed to many substances that would otherwise react with optical absorber 118. For example, aggressive cleaning equipment and solutions may be used to clean the photomask, and protective layer 120 will prevent the cleaner from reacting with optical absorber 118 and prevent the equipment from physically damaging optical absorber 118.

Figure 4F:
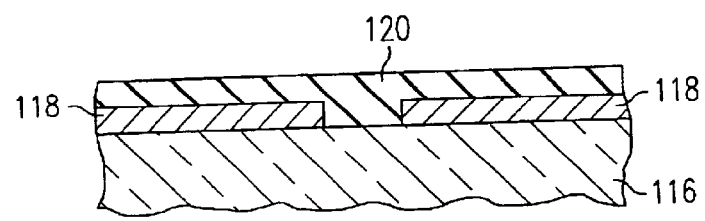
Figure 5D:
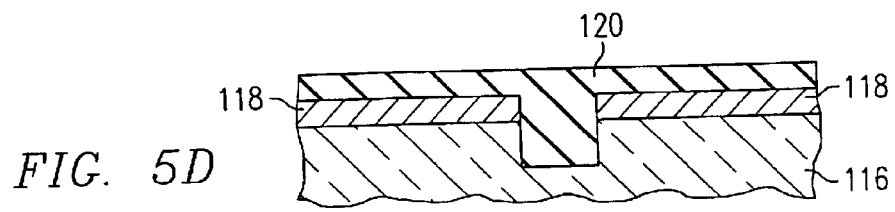

Once coated with protective layer 120, photomask 112 may then be cleaned, inspected, and shipped to a customer for use in fabricating integrated circuits, for example. Alternatively, one or more additional, optional steps may be performed in the fabrication process. For instance, depending on factors such as the conformality of protective coating 120 and the sizes of the features in the mask pattern, dimples may have formed in protective coating 120, as depicted in FIGS. 4E and 5C. In such cases, it may be desirable to smooth or planarize the surface of protective coating 120, as shown in FIGS. 4F and 5D and in block 218 of FIGS. 6 and 7. For instance, chemical mechanical polishing (CMP) may be used to produce a flat or substantially flat surface on protective layer 120. Planarizing the surface of protective layer 120 may further reduce the likelihood of arcing, because the charge buildup that normally occurs on an insulator surface may be distributed more evenly if the insulator is flat instead of full of relief features.

Figure 4G:
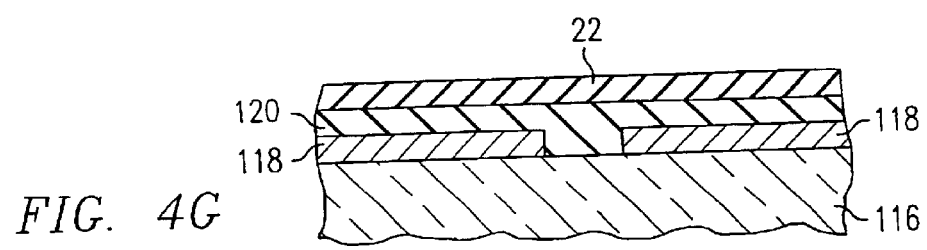
Figure 5E:
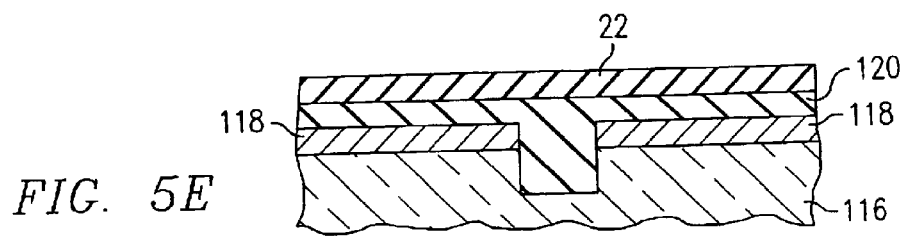

As depicted at block 220 of FIGS. 6 and 7 and in FIGS. 4G and 5E, it may also be desirable to apply an antireflective (AR) coating 22 onto protective layer 120 to increase the percentage of EMR transmitted through protective layer 120. In the example embodiments, magnesium fluoride ($MgF_2$) is used as AR coating 22, but other materials (e.g., aluminum flouride ($AlF_3$)) may be used in alternative embodiments.

Figure 4H:
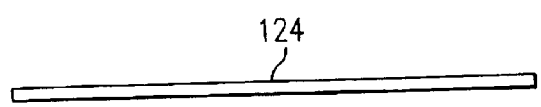
Figure 4H:
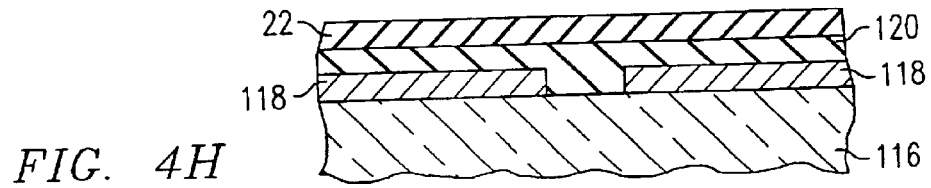
Figure 5F:
Figure 5F:
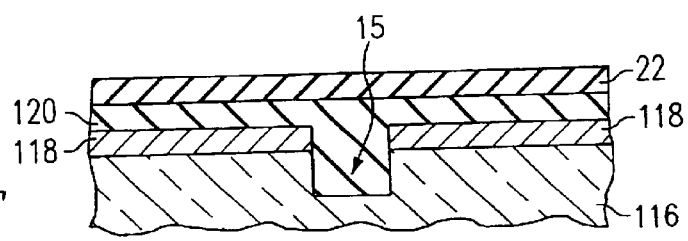

In addition, as shown in block 222 of FIGS. 6 and 7 and in FIGS. 4H and 5F, the manufacturer may attach a pellicle to the photomask before shipping the photomask to the customer. As explained above, the pellicle may include a pellicle membrane 124 that is suspended a certain distance above protective layer 120 and AR layer 22 by a pellicle frame, so that if any dirt (e.g., dust particles) sticks to pellicle membrane 124, those particles will be out of focus with respect to the image that the photomask produces on an object substrate when the photomask is transilluminated. Pellicle membrane 124 may also provide additional protection against pattern damage.

For some applications, transparent substrate 116 may be approximately 6.35 millimeters (mm) thick, chrome 118 may be approximately 100 nm thick, protective layer 120 may be approximately 200 nm thick, and AR coating 22 may be approximately 45 nm deep. Also, pellicle membrane 124 may be suspended approximately 7 mm above the surface of chrome 118. In FIG. 5F, trench 15 may be approximately 250 nm deep and the other measurements may be similar to those in FIG. 4H. The exact thicknesses and heights of the various components in FIGS. 4H and 5H will depend on the optical properties of the materials used. Furthermore, different measurements may be used for many or all of those components in alternative embodiments.

In conclusion, the photomasks in the example embodiments include one or more protective layers that coat the photomask pattern to protect that pattern from damage. Preferably, such a photomask may be used in an otherwise conventional lithography system, in place of a conventional photomask, to produce an image such as an integrated circuit layer on an object substrate such as a silicon wafer.

Although various example embodiments of the invention have been described in detail, it should be understood that various changes and substitutions can be made without departing from the spirit and scope of the invention. For example, the example embodiments involved binary and AAPS masks, but the invention may also be practiced with other types of masks, such as embedded phase shift masks. Also, additional layers may be provided on the photomask. For example, an AR layer may be deposited on the absorber either before the photoresist is deposited on the absorber or after the photoresist has been stripped from the absorber. Myriad additional variations will be apparent to those of ordinary skill in the art.

It should therefore be understood that the invention is not limited to the illustrated embodiments, but is defined by the appended claims.

What is claimed is:

1. A method for fabricating a damage resistant photomask, the method comprising:

forming a photomask pattern including a plurality of features on a substrate, the features formed of an optical absorber; and forming a transparent, protective coating on and in contact with the photomask pattern, the transparent, protective coating operable to prevent the features from being damaged by electrostatic discharge.

2. The method of claim 1, wherein forming the transparent, protective coating on the photomask pattern comprises coating the photomask pattern with a material that has an electrical resistivity of at least ten ohm meters.

3. The method of claim 2, wherein the material comprises spin-on glass.

4. The method of claim 1, wherein forming the photomask pattern comprises:

forming a layer of the absorber on the substrate; and removing portions of the absorber from the substrate to form at least one trench in the absorber layer; and wherein the protective coating extends into the at least one trench in the absorber layer.

5. The method of claim 1, wherein forming the photomask pattern comprises:

forming a layer of the absorber on the substrate; and removing portions of the absorber from the substrate to form a pattern with clear areas and opaque areas; and removing material from the substrate in one or more of the clear areas to form one or more trenches in the substrate.

6. The method of claim 1, wherein forming a transparent, protective coating the photomask pattern comprises:

depositing material on the photomask pattern; and curing the material to form the transparent, protective coating.

7. The method of claim 1, further comprising planarizing the transparent, protective coating.

8. The method of claim 1, further comprising forming an antireflective layer on the transparent, protective coating.

9. The method of claim 1, further comprising forming the transparent, protective coating from a material selected from the group consisting of silicon dioxide ($SiO_2$), aluminum oxide ($Al_2O_3$), aluminum nitride (AlN), silicon nitride ($Si_3N_4$), tantalum oxide ($Ta_2O_5$), yttrium oxide ($Y_2O_3$), magnesium fluoride ($MgF_2$), magnesium oxide (MgO), zirconium oxide ($ZrO_2$), lithium fluoride (LiF), aluminum fluoride ($AlF_3$), and calcium fluoride ($CaF_2$).

10. The method of claim 1, wherein forming the transparent, protective coating comprises using a technique selected from the group consisting of physical vapor deposition, chemical vapor deposition, and gas phase deposition techniques to form the transparent, protective coating.

11. A damage resistant photomask, comprising:

a photomask pattern including a plurality of features formed on a substrate, the features formed of an optical absorber; and a transparent, protective layer formed on and in contact with the photomask pattern, the transparent, protective coating operable to prevent the features from being damaged by electrostatic discharge.

12. The photomask of claim 11, wherein the transparent, protective layer comprises a material that has an electrical resistivity of at least ten ohm meters.

13. The photomask of claim 12, wherein the material comprises spin-on glass.

14. The photomask of claim 11, further comprising:

the substrate formed from transparent material;

a patterned layer of the absorber formed on the substrate; and the transparent, protective layer covering the absorber.

15. The photomask of claim 11, further comprising:

the substrate formed from transparent material;

a patterned layer of the absorber formed on the substrate;

trenches formed in the substrate; and the transparent, protective layer covering the absorber.

16. The photomask of claim 11, further comprising an antireflective layer formed on the transparent, protective layer.

17. The photomask of claim 11, further comprising a pellicle attached over the transparent, protective layer.

18. The photomask of claim 11, wherein the transparent, protective coating comprises a material selected from the group consisting of silicon dioxide ($SiO_2$), aluminum oxide ($Al_2O_3$), aluminum nitride (AlN), silicon nitride ($Si_3N_4$), tantalum oxide ($Ta_2O_5$), yttrium oxide ($Y_2O_3$), magnesium fluoride ($MgF_2$), magnesium oxide (MgO), zirconium oxide ($ZrO_2$), lithium fluoride (LiF), and aluminum fluoride ($AlF_3$).

19. A damage resistant photomask, comprising:

a patterned absorber layer including a plurality of clear areas and a plurality of opaque areas formed on at least a portion of a substrate; and a transparent protective layer formed on and in contact with the absorber layer, the transparent, protective coating operable to prevent the opaque areas from being damaged by electrostatic discharge.

20. The photomask of claim 19, wherein the protective layer comprises a dielectric material.

21. The photomask of claim 19, further comprising:

the substrate including a first refractive index; and the protective layer including a second refractive index greater than the first refractive index.

22. The photomask of claim 19, further comprising:

a trench formed in the substrate proximate at least one of the clear areas, the trench including a bottom and at least one wall; and the protective layer formed in the trench.

* * * * *